United States Patent [19]

Shiga

[11] Patent Number: 4,922,248

[45] Date of Patent: May 1, 1990

[54] KEY OUTPUT METHOD FOR KEYBOARDS

[75] Inventor: Sadakazu Shiga, Iwaki, Japan

[73] Assignee: Alps Electric Co., Ltd., Tokyo, Japan

[21] Appl. No.: 275,697

[22] Filed: Nov. 23, 1988

Related U.S. Application Data

[63] Continuation of Ser. No. 81,529, Aug. 3, 1987, which is a continuation of Ser. No. 758,523, Jul. 24, 1985, abandoned.

[30] Foreign Application Priority Data

Jul. 24, 1984 [JP] Japan .................................. 59-153784

[51] Int. Cl.$^5$ .............................................. G06F 3/02
[52] U.S. Cl. ........................................ 341/25; 341/24; 341/26
[58] Field of Search ............ 340/365 E, 365 R, 365 S; 341/24, 25, 26, 5; 178/17 C

[56] References Cited

U.S. PATENT DOCUMENTS

| | | | |
|---|---|---|---|
| 3,493,928 | 2/1970 | Juliusberger | 340/365 E |
| 3,745,536 | 7/1973 | Klehm | 340/365 E |
| 4,106,011 | 8/1978 | Melanson et al. | 340/365 E |
| 4,231,016 | 10/1980 | Ueda | 340/365 E |
| 4,420,744 | 12/1983 | Tesson | 340/365 E |
| 4,581,603 | 4/1986 | Ingold et al. | 340/365 E |

FOREIGN PATENT DOCUMENTS

| | | | |
|---|---|---|---|
| 0089646 | 9/1983 | European Pat. Off. | 340/365 E |
| 0122928 | 9/1979 | Japan | 340/365 E |

OTHER PUBLICATIONS

Bland and Bolt, "Phantom Key Detection/Phantom Key Scan Code", IBM Technical Disclosure Bulletin, vol. 27, No. 7A, Dec. 1984.

"Solution to Phantom Key Problems", IBM Technical Disclosure Bulletin, vol. 28, No. 5, Oct. 1985.

*Primary Examiner*—Alvin Oberley
*Attorney, Agent, or Firm*—Guy W. Shoup; Brian D. Ogonowsky

[57] ABSTRACT

A keyboard with N-key rollover has a matrix of key columns and lines for successively issuing key codes for depressed keys. When first and second keys on the same column are detected as being depressed and then a third key on the same line as one of the first and second keys is detected as being depressed, or when first and second keys on the same line are detected as being depressed and then a third key on the same column as one of the first and second keys is detected as being depressed, a key code for the third key or a key code for a fourth key detected in error upon depression of the third key are prevented from being issued.

2 Claims, 4 Drawing Sheets

Fig.2(a)

| 1 | 2 | 3 | 4 | 5 | 6 |
|---|---|---|---|---|---|
| 7 | 8 | 9 | 10 | 11 | 12 |
| 13 | 14 | 15 | 16 | 17 | 18 |
| 19 | 20 | 21 | 22 | 23 | 24 |
| 25 | 26 | 27 | 28 | 29 | 30 |

Fig.2(b)

| 0 | 1 | 0 | 0 | 1 | 0 |
|---|---|---|---|---|---|
| 0 | 0 | 0 | 0 | 0 | 0 |
| 0 | 1 | 0 | 0 | 1 | 0 |
| 0 | 0 | 0 | 0 | 0 | 0 |
| 0 | 0 | 0 | 0 | 0 | 0 |

Fig.2(c)

| 0 | 1 | 0 | 0 | 0 | 0 |
|---|---|---|---|---|---|
| 0 | 0 | 0 | 0 | 0 | 0 |
| 0 | 0 | 0 | 1 | 0 | 0 |
| 0 | 1 | 0 | 0 | 0 | 0 |
| 0 | 0 | 0 | 0 | 0 | 0 |

Fig.2(d)

| 0 | 0 | 0 | 0 | 0 | 0 |
|---|---|---|---|---|---|
| 0 | 0 | 1 | 0 | 1 | 0 |
| 0 | 0 | 0 | 0 | 0 | 0 |
| 0 | 1 | 0 | 0 | 0 | 0 |
| 0 | 0 | 0 | 0 | 0 | 0 |

KEY OUTPUT METHOD FOR KEYBOARDS

This application is a continuation of application Ser. No. 07/081,529, filed Aug. 3, 1987, which is a continuation of application Ser. No. 06/758,523, filed July 24, 1985, now abandoned.

BACKGROUND OF THE INVENTION

The present invention relates to a keyboard with N-key rollover, and more particularly to a key output method in a keyboard, which requires no diodes for preventing a roundabout current.

FIG. 4 of the accompanying drawings is a block diagram of a keyboard input device having an N-key rollover function. A key matrix 1 is composed of a matrix of keys 2 and diodes 3 connected in series thereto, respectively. The key matrix 1 has columns 1a connected to a decoder 4. The decoder 4 and lines 1b of the key matrix 1 are connected to a CPU 5.

A ROM 6 storing key codes and a program for issuing them is connected to the CPU 5.

When one of the keys is depressed, a scanning signal from the decoder 4 is applied through one of the columns 1a, the depressed key and the diode connected thereto, and a corresponding one of the lines 1b, to the CPU 5. The CPU 5 detects the depressed key based on the scanning position (column position) and the line position. A key code corresponding to the detected key is then read out of the ROM 6 and issued.

While the keyboard is operated on at a high speed, a plurality of keys are sometimes depressed concurrently. The N-key rollover function allows all output signals from the depressed keys to be issued. This rollover function requires the use of diodes 3 associated respectively with the keys 2 for the reason that when three or more keys sharing common rows and columns are concurrently depressed, a roundabout current flows to let an undepressed key be detected as being a turned-on key. This condition is known conventionally as "a phantom switch condition", since depression of three keys at three corners of a rectangle of rows and columns causes erroneous detection of the fourth corner as being depressed.

The keyboard with the N-key rollover function is therefore of a high cost since as many diodes are required as there are keys.

SUMMARY OF THE INVENTION

With the foregoing problem in view, it is an object of the present invention to achieve a cost reduction by eliminating diodes for preventing a roundabout current in a keyboard with N-key rollover.

According to a key output method for a keyboard with N-key rollover, when first and second keys on the same column are detected as being depressed and then a third key on the same line as one of the first and second keys is detected as being depressed, or when first and second keys on the same line are detected as being depressed and then a third key on the same column as one of the first and second keys is detected as being depressed, a key code for the third key and a key code for a fourth key detected in error upon depression of the third key are prevented from being issued.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 2 is a set of diagrams showing contents of a RAM;

DESCRIPTION OF THE PREFERRED EMBODIMENT

Figure 1:
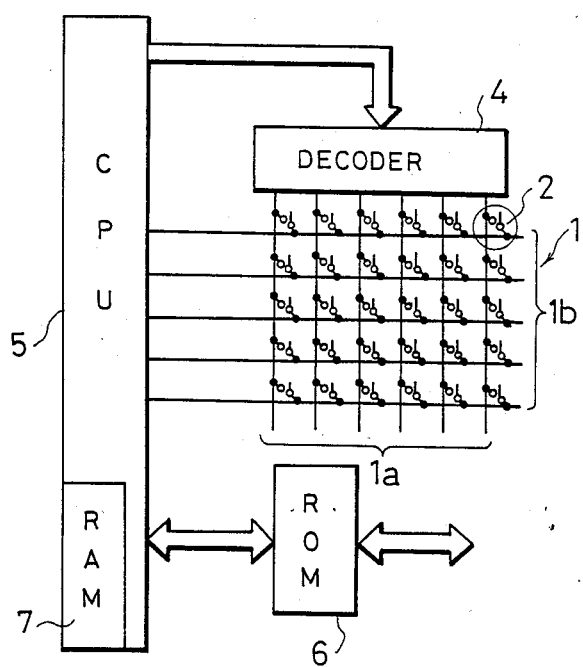
FIG. 1 is a block diagram of a keyboard input device according to the present invention.
Figure 4:
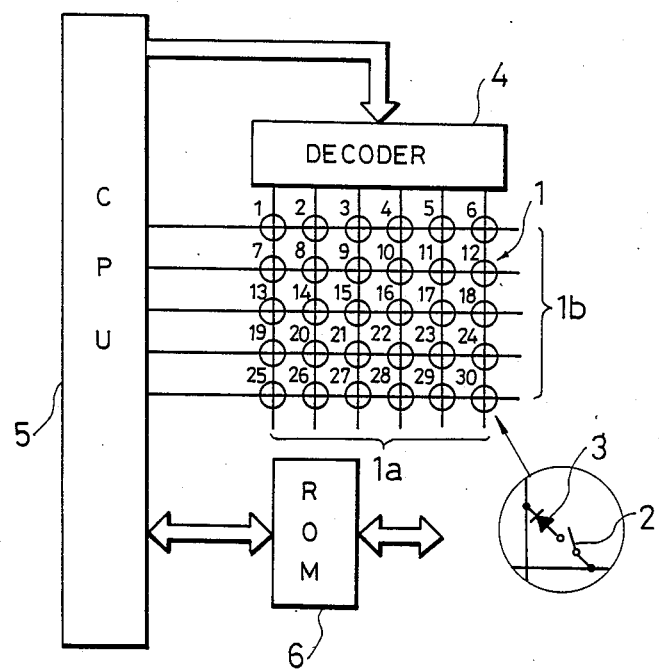
FIG. 4 is a block diagram of a conventional keyboard input device with an N-key rollover function.

Like or identical parts shown in FIG. 1 are denoted by like or identical reference characters in FIG. 4 and will not be described in detail.

As shown in FIG. 1, the CPU 5 includes a RAM 7 for storing items of positional information respectively for the keys of the key matrix 1. When one of the keys is depressed, a flag in the RAM 7 corresponding to the depressed key is set to "1". When the depressed key is released, the flag is reset to "0".

When the keys Nos. 2, 14, 17 as shown in FIG. 2(a) are concurrently depressed (phantom switch condition), the corresponding flags in the RAM 7 are set as shown in FIG. 2(b). With no diodes for preventing a roundabout current, the key No. 5 in addition to the keys Nos. 2, 14, 17 is also detected as being turned on.

According to an embodiment of the present invention, the keyboard output device will operate as described below when the keys Nos. 2, 14, 17 are concurrently depressed as shown in FIGS. 2(a) and (b).

If the key No. 2 is first detected according to the timing of key scanning, then the key No. 14 on the same column as the key No. 2 is also detected. When the CPU 5 processes the key No. 2 at first, the memory in the RAM 7 corresponding to the key No. 2 is set to "1". Then, whether an output should be issued from the key No. 2 or not is checked by ascertaining whether there is a flag "1" in the RAM 7.

Since the key No. 2 is the sole key first processed and there are no other detected keys (represented by the flag "1") on the same line and column as the key No. 2, a key code corresponding to the key No. 2 in the ROM 6 is read and issued out.

Then, the key No. 14 is processed in the CPU 5, and the memory in the RAM 7 corresponding to the key No. 14 is set to "1". Whether an output should be issued from the key No. 14 or not is checked by ascertaining whether there is a flag "1" in the RAM 7.

Although there are no other depressed keys on the same line as the key No. 14, there is the flag "1" for the key No. 2 previously detected on the same column. Then, whether there are other detected keys (represented by the flag "1") on the same line as the key No. 2 is determined. As there are no such detected keys, a key code corresponding to the key No. 14 in the ROM 6 is read and issued out. Then, the key No. 17 is detected and a flag "1" is set in the RAM 6. Since the keys Nos. 2 and 14 remain depressed at this time, a scanning signal is applied through from the key No. 17 through the keys Nos. 14 and 2 to the CPU 5 which now detects as if the undepressed key No. 5 were depressed due to a roundabout current. Therefore, the keys Nos. 5 and 17 are also detected. The CPU 5 then processes the keys Nos. 5 and 17 one after the other.

However, no output from these keys Nos. 5 and 17 is issued no matter which key may be processed first. More specifically, if the key No. 17 is processed first, then there are three flags "1" in the RAM 7. The flag "1" for the key No. 14 is present on the same line as the key No. 17, and the flag "1" for the key No. 2 is present on the same column as the key No. 14, so that no key code for the key No. 17 is issued. If the key No. 5 is processed first, then a memory corresponding to the key No. 5 in the RAM 6 is set to "1", and there are four flags "4" in the RAM 6. The flags "1" for the keys Nos. 2 and 17 are present on the same column and line as the key No. 5, and the flag "1" for the key No. 14 is present on the same column as the key No. 2 or the same line as the key No. 17, so that no key code for the key No. 5 is issued.

As described above, when a plurality of keys are concurrently depressed to cause a phantom condition to arise, the key codes of the first two keys depressed will always be issued, while no key code for the third key and additional keys depressed will be issued. When keys are depressed key and following will be issued.

When keys are depressed in patterns as illustrated in FIGS. 2(c) and (d), there no undepressed keys which are detected as being depressed, as with the key No. 5 in FIG. 2(b), and hence key codes for all of the depressed keys are issued.

Figure 3:
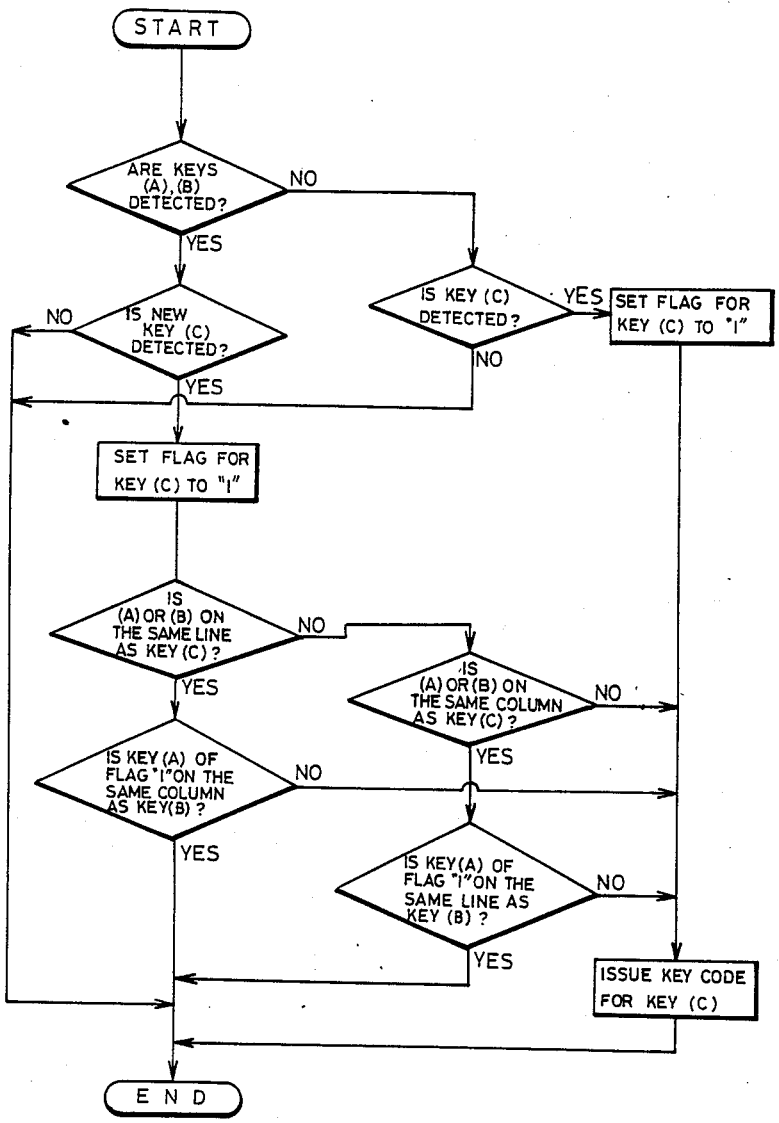
FIG. 3 is a flowchart of successive steps of a key output method of the invention.

The above operation will be described with reference to the flowchart of FIG. 3.

If two keys such as A, B are not detected or one of the two keys is detected, the flag in the memory corresponding to a next detected key C is set to "1", and a key code for the key C is issued.

If the keys A, B are both detected with their key codes issued and then the key C is detected, i.e., if the keys A, B, C are concurrently depressed, then the flag in the memory corresponding to the key C is set to "1" first. Thereafter, whether either of the keys A or B is on the same line as the key C is checked by ascertaining whether there is a flag "1" in the memory in the RAM 7. If either of the keys A or B is on the same line as the key C, then whether the key A of the flag "1" is on the same column as the key B is checked. If the key A is on the same column as the key B, then no key code for the key C is issued.

If either of the keys A or B is not on the same line as the key C, then whether either of the keys A or B is on the same column as the key C is checked. If either of the keys A or B is not on the same column as the key C, the key code for the key C is issued. If either of the keys A or B is on the same column as the key C, then whether the key A is on the same line as the key B is checked. If the key A is on the same line as the key B, then the key code for the key C is not issued, and if the key A is not on the same line as the key B, then the key code for the key C is issued. Where no key code is issued for the key C, a next fourth key is detected. The fourth key is also checked according to the above checking process, and its key code is not issued.

With the present invention, the keyboard output device is essentially operated in a 2-key rollover mode (lockout) only when keys are depressed in a phantom switch condition to cause a malfunction, and in an N-key rollover mode in other occasions. The keyboard is of a low cost as there are no diodes employed.

Although a certain preferred embodiment has been shown and described, it should be understood that many changes and modifications may be made therein without departing from the scope of the appended claims.

What is claimed is:

1. A method of controlling the issuance of keyboard signals from a keyboard system having a matrix of rows and columns of lines which can be electrically interconnected by a corresponding key at each intersection of the rows and columns, the system also having a memory with a plurality of memory locations each corresponding to a respective key, said method comprising the steps of:
  (1) detecting whether two keys of said keyboard system are concurrently depressed by determining the number of flags in said memory, each of said flags being an indication in a memory location that a particular key is currently being depressed, each memory location being associated with a predetermined key;
  (2) upon detection in step 1 of two keys not being concurrently depressed, detecting whether a key has been newly depressed since the detecting step of step 1;
  (2a) upon detection in step 2 of a key being newly depressed, setting a flag in a memory location associated with said key being newly depressed and issuing a key code representing said key being newly depressed;
  (2b) upon detection in step 2 of no key being newly depressed, returning to step 1;
  (3) upon detection in step 1 of two keys being concurrently depressed, detecting whether a key has been newly depressed since the detecting step of step 1;
  (3a) upon detection in step 3 of a key being newly depressed, setting a flag in a memory location associated with said key being newly depressed and determining, by checking flagged memory locations, whether a condition exists which gives rise to a false indication of a key depression;
  (3b) upon determination in step 3a that said condition giving rise to a false indication of a key depression does exist, returning to step 1 without issuing a key code representing said key detected as being newly depressed in step 3;
  (3c) upon determination in step 3a that said condition-giving rise to a false indication of a key depression does not exist, issuing a key code representing said key detected as being newly depressed in step 3; and
  (3d) upon detection in step 3 of no key being newly depressed, returning to step 1.

2. The method of claim 1, wherein said keyboard is connected to a central processing unit for detecting when said keys are depressed, said central processing unit including a random-access memory for storing said flags corresponding to respective keys in said keyboard.

* * * * *